United States Patent [19]

Tanaka et al.

[11] Patent Number: 4,942,317
[45] Date of Patent: Jul. 17, 1990

[54] MASTER SLICE TYPE SEMICONDUCTOR INTEGRATED CIRCUIT HAVING 2 OR MORE I/O CELLS PER CONNECTION PAD

[75] Inventors: Yasunori Tanaka, Yokohama; Teruo Kobayashi, Tokyo; Masahiro Ishibashi, Yokohama, all of Japan

[73] Assignee: Kabushiki Kaisha Toshiba, Kawasaki, Japan

[21] Appl. No.: 351,001

[22] Filed: May 12, 1989

[30] Foreign Application Priority Data

May 16, 1988 [JP] Japan .................. 63-118765

[51] Int. Cl.⁵ .............................. H03K 17/12
[52] U.S. Cl. .................. 307/465; 307/303.1; 307/475; 364/490; 357/45
[58] Field of Search ........... 307/451, 465, 475, 303.1; 357/45; 361/58, 93; 364/490-491

[56] References Cited

U.S. PATENT DOCUMENTS

| 4,523,106 | 6/1985 | Tamizawa et al. | 364/490 X |
| 4,651,190 | 3/1987 | Suzuki et al. | 357/45 |
| 4,682,202 | 7/1987 | Tamizawa | 357/45 |
| 4,692,783 | 9/1987 | Monma et al. | 357/45 X |
| 4,727,266 | 2/1988 | Fujii et al. | 307/451 X |
| 4,733,288 | 3/1988 | Sato | 357/45 X |
| 4,766,475 | 8/1988 | Kawashima | 357/45 X |
| 4,819,047 | 4/1989 | Gilfeather et al. | 357/45 X |
| 4,825,107 | 4/1989 | Naganuma et al. | 364/491 X |
| 4,864,381 | 9/1989 | Seefeldt et al. | 364/491 X |
| 4,868,630 | 9/1989 | Tanizawa et al. | 357/45 |

FOREIGN PATENT DOCUMENTS 60-169150  2/1985  Japan .

Primary Examiner—David Hudspeth
Attorney, Agent, or Firm—Finnegan, Henderson, Farabow, Garrett, and Dunner

[57] ABSTRACT

An internal logic block is arranged in a chip body, and I/O cells and pads are arranged in a peripheral portion of the chip body. Three I/O cells are arranged for each pad.

6 Claims, 4 Drawing Sheets

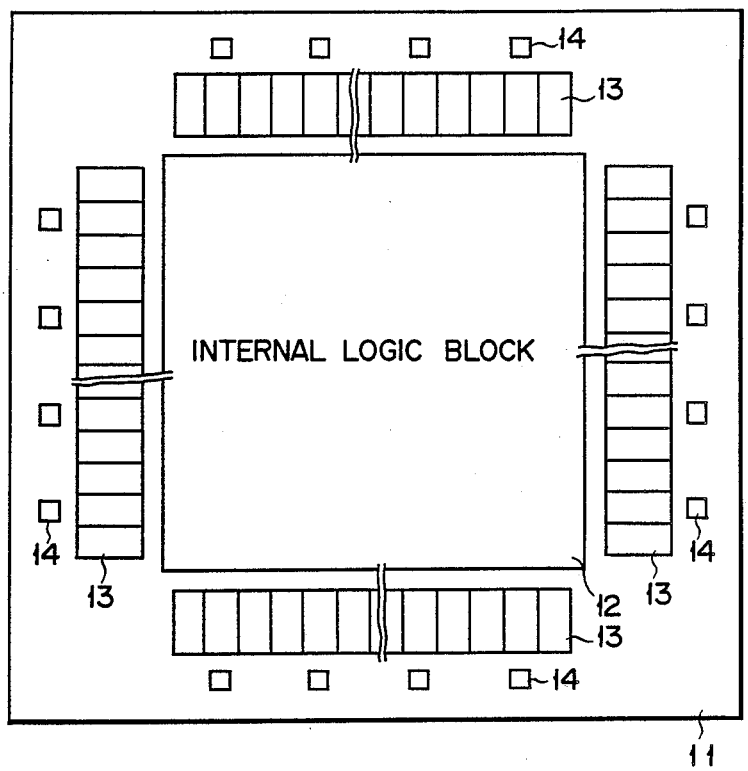
F I G. 3
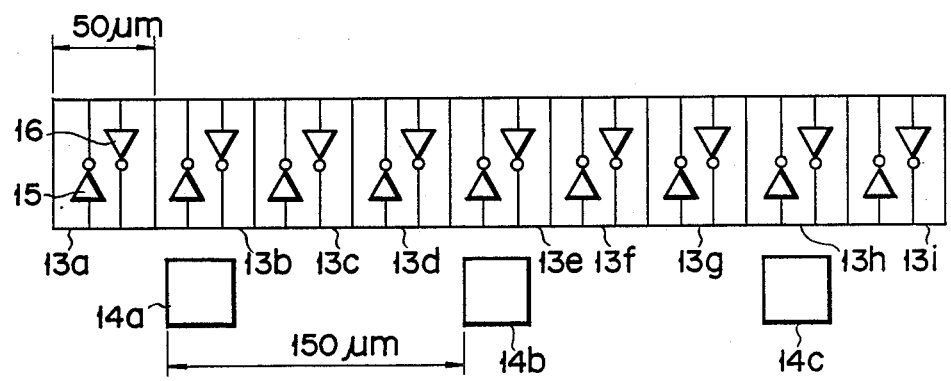
F I G. 4

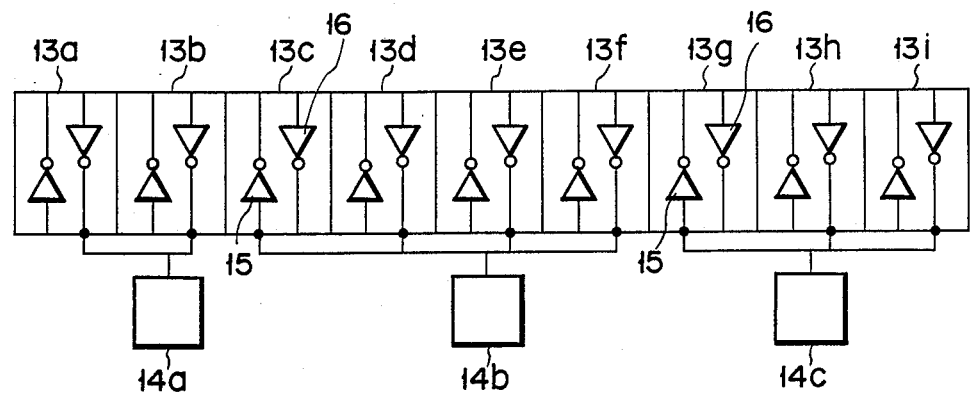
F I G. 5
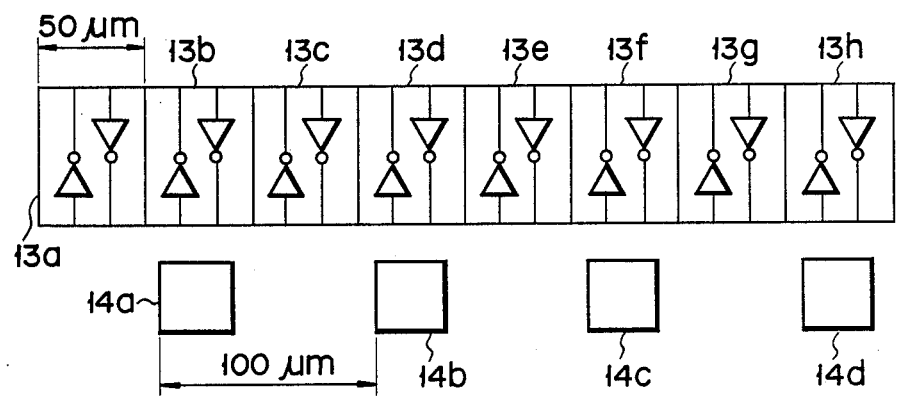
F I G. 6

MASTER SLICE TYPE SEMICONDUCTOR INTEGRATED CIRCUIT HAVING 2 OR MORE I/O CELLS PER CONNECTION PAD

BACKGROUND OF THE INVENTION

1. Field of the Invention

The present invention relates to a master slice type semiconductor integrated circuit capable of appropriately selecting a load drive capacity of an output signal.

2. Description of the Related Art

Basic logic gates are formed at a master level, and a wiring pattern for connecting these basic logic gates is formed in a subsequent step to obtain a basic logic gate circuit or an input/output circuit. The master slice scheme has an advantage in that various types of ICs in small quantities can be manufactured within a short period of time.

FIG. 1 is a view showing chip layout of a conventional master slice type semiconductor integrated circuit. An internal logic block 22 is formed at the center of a chip body 21, and I/O cells 23 constituted by input and output buffers and the like (not shown) are arranged in the peripheral portion at a predetermined pitch. A pad 24 is arranged for each I/O cell in a one-to-one correspondence. The pads 24 are arranged at the same pitch as the I/O cells. After the step of the master level, a wiring pattern is formed to connect the components within the internal logic block 22, between the internal logic block 22 and the I/O cells 23, and between the I/O cells 23 and the corresponding pads 24. Each pad 24 serves as an input or output pad, or an input/output pad. After the wiring pattern on the chip body is formed, each pad is wire-bonded to a corresponding pin of an IC.

The electrical characteristics such as a load drive capacity as well as areas of the respective I/O cells 23 are equal to each other in favor of easy cell design. For this reason, when a large load capacitor is driven, the drive capacity may be insufficient when only one I/O cell is used. In a conventional arrangement, as shown in FIG. 2, in order to increase the load drive capacity, output buffers in a plurality of I/O cells are connected in parallel with each other, as disclosed in Japanese Patent Disclosure (Kokai) No. 60-169150. Referring to FIG. 2, reference numerals 23a to 23e denote I/O cells each including an input buffer 25 and an output buffer 26; and 24a to 24e, pads formed in one-to-one correspondence with the I/O cells 23a to 23e. The pads 24a, 24c, and 24d are connected to only the input buffers 25 in the I/O cells 23a, 23c, and 23d, respectively. In this case, these pads are used as the input pads. The pad 24b is connected in parallel with the output buffers 26 in the two I/O cells 23a and 23b. The pad 24b is used as an output pad having a load drive capacity twice an I/O cell. The pad 24e is connected in parallel with output buffers 26 in the three I/O cells 23c, 23d, and 23e. The pad 24e is used as an output pad having a load drive capacity three times an I/O cell.

As described above, output buffers in a plurality of I/O cells are connected in parallel with each other at the time of formation of a wiring pattern. Therefore, the load drive capacity can be arbitrarily selected without changing the size of the chip body.

In the conventional IC shown in FIG. 2, when a pad pitch must be changed due to demand for a multi-pin IC, I/O cells each having a new shape must be designed again, thus wasting time and cost.

SUMMARY OF THE INVENTION

The present invention has been made in consideration of the above situation, and has as its object to provide a master slice type semiconductor integrated circuit wherein I/O cells need not be designed again when pad pitches are changed, and a load drive capacity can be arbitrarily selected without changing the size of a chip body.

According to the present invention, there is provided a master slice type semiconductor integrated circuit comprising a plurality of pads arranged at a predetermined pitch and n (n is an integer of 2 or more) I/O cells arranged for each of the plurality of pads, each I/O cell being provided with at least a buffer, wherein the number n of I/O cells per pad is set in accordance with the pad pitch.

Furthermore, according to the present invention, there is provided a master slice type semiconductor integrated circuit, comprising a plurality of pads arranged at a predetermined pitch, and I/O cells, the number of which is an m (m is an integer of 2 or more) multiple of pads, each I/O cell being provided with at least a buffer.

BRIEF DESCRIPTION OF THE DRAWINGS

FIG. 3 is a plan view showing chip layout of a semiconductor integrated circuit according to an embodiment of the present invention;

FIG. 4 is a plan view showing only a peripheral portion of the integrated circuit shown in FIG. 3;

FIG. 5 is a plan view showing a state wherein a wiring pattern is formed in the integrated circuit shown in FIG. 4;

FIG. 6 is a plan view showing a state wherein the wiring pattern is formed after a pad pitch is changed in the integrated circuit shown in FIG. 4;

DETAILED DESCRIPTION OF THE PREFERRED EMBODIMENTS

Figure 1:
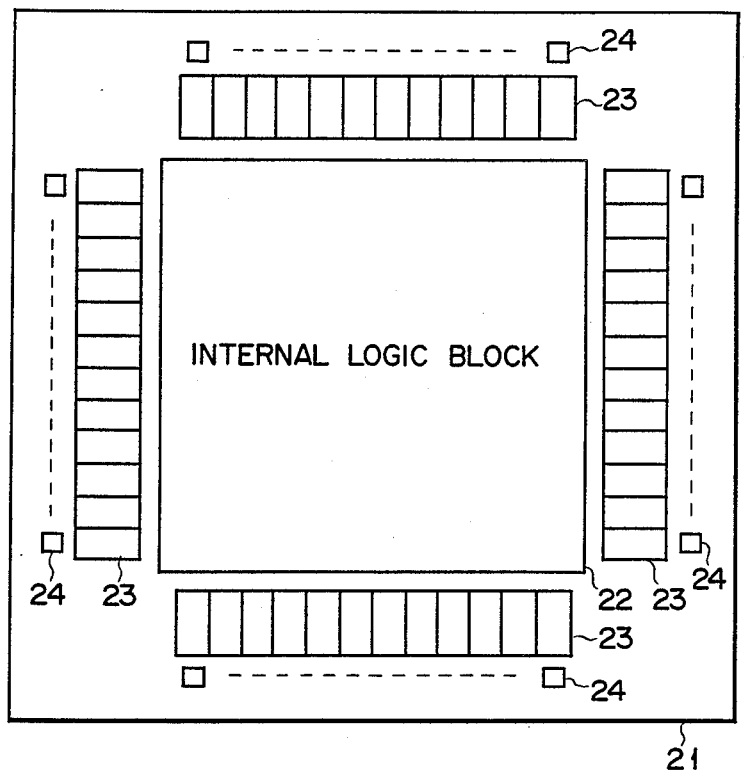
FIG. 1 is a plan view showing chip layout of a conventional integrated circuit.
Figure 2:
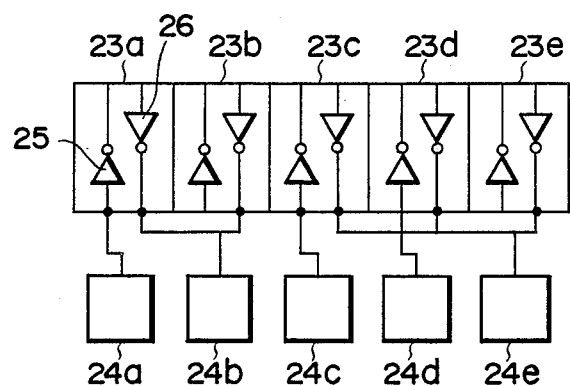
FIG. 2 is a plan view showing only a peripheral portion of the conventional integrated circuit shown in FIG. 1.

The present invention will be described with reference to a preferred embodiment in conjunction with the accompanying drawings.

FIG. 3 is a view showing chip layout of a master slice type semiconductor integrated circuit according to an embodiment of the present invention. Referring to FIG. 3, reference numeral 11 denotes a chip body; and 12, an internal logic block. A plurality of I/O cells 13 and a plurality of pads 14 are arranged in a peripheral portion of the chip body 11. In this embodiment, three I/O cells 13 are arranged for each pad 14. That is, the number of I/O cells 13 is three times that of the pads 14 in the chip body 11.

FIG. 4 is a plan view showing only an IC peripheral portion of the above embodiment. Reference numerals 13a to 13i denote I/O cells each including an input buffer 15 and an output buffer 16. Reference numerals 14a, 14b, and 14c denote pads, respectively. The three I/O cells 13a, 13b, and 13c are arranged for the pad 14a, the three I/O cells 13d, 13e, and 13f are arranged for the pad 14b, and the three I/O cells 13g, 13h, and 13i are arranged for the pad 14c.

The input buffers 15 included in the respective I/O cells 13 have equal electrical characteristics. Similarly, the output buffers 16 have equal electrical characteristics such as a load drive capacity. The respective I/O cells 13 have equal areas.

The size of each of the I/O cells 13a to 13i along its alignment direction is defined as, e.g., 50 μm, and the pads 14 are arranged at a pitch of 150 μm, as shown in FIG. 4.

FIG. 5 shows a state wherein a wiring pattern is formed in the IC having the arrangement described above. The pad 14a is connected in parallel with the output buffers 16 of the I/O cells 13a and 13b. The pad 14a is used as an output pad having a load drive capacity twice an I/O cell. The pad 14b is connected in parallel with the input buffer 15 of the I/O cell 13c and the output buffers 16 of the I/O cells 13d, 13e, and 13f. The pad 14b serves as an input/output pad having a load drive capacity three times an I/O cell. The pad 14c is connected in parallel with the input buffer 15 of the I/O cell 13g and the output buffers 16 of the I/O cells 13h and 13i. The pad 14b serves as an output/input pad having a load drive capacity twice an I/O cell.

As described above, a plurality of output buffers are connected in parallel with one output pad during formation of a wiring pattern. Therefore, the load drive capacity can be arbitrarily selected without changing the size of the chip body.

In the IC of the present invention, a plurality of I/O cells are arranged for each pad. This arrangement is compatible with a change in pad pitch without redesigning the I/O cell. For example, in the arrangement of FIG. 4, the pitch of the pads 14 is set to be 150 μm. If the pad pitch must be reduced to 100 μm, two I/O cells can be arranged for each pad. That is, as shown in FIG. 6, two I/O cells 13a and 13b are arranged for a pad 14a, two I/O cells 13c and 13d are arranged for a pad 14b, two I/O cells 13e and 13f are arranged for a pad 14c, and two I/O cells 13g and 13h are arranged for a pad 14d. The I/O cells 13 can be the same as those in FIG. 4. Therefore, I/O cells need not be designed again. The circuit arrangement in FIG. 6 can be manufactured by reducing only the number of I/O cells as compared with the number of I/O cells in the IC of FIG. 4. In addition, even if the pad pitch is changed, a relative position between each pad 14 and the corresponding I/O cell 13 is kept unchanged. More specifically, the center of each pad 14 can always be aligned with that of the corresponding I/O cell 13, so that automatic computer-aided wiring can be performed to form a wiring pattern.

Figure 7:
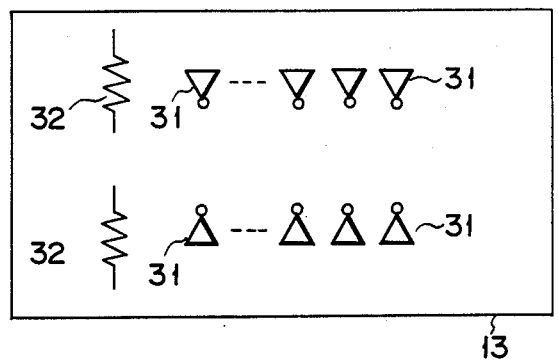
FIG. 7 is an equivalent circuit diagram of an I/O cell used in the integrated circuit in FIG. 3 before a wiring pattern is formed.

The present invention is not limited to the above embodiment. Various changes and modifications may be made within the spirit and scope of the invention. For illustrative convenience, each I/O cell of the above embodiment consists of one input buffer and one output buffer. However, the present invention is also applicable to a general I/O cell including an input protective resistor or diode, transistor, and the like. For example, FIG. 7 shows an arrangement of an I/O cell 13 used in a practical IC before a wiring pattern is formed. A plurality of inverters 31 which constitute an input buffer and an output buffer and input protective resistors 32 are formed in the I/O cell 13.

Figure 8:
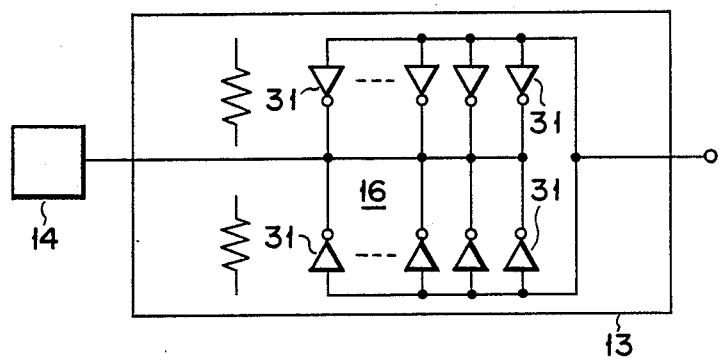
FIG. 8 is an equivalent circuit diagram showing a state wherein a wiring pattern is formed for the I/O cell shown in FIG. 7.
Figure 9:
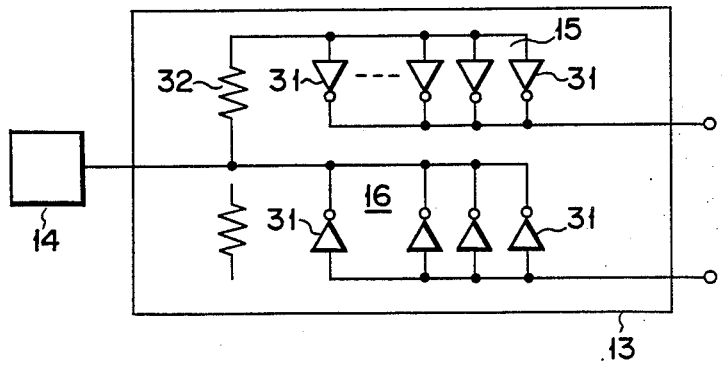
FIG. 9 is an equivalent circuit diagram showing a state after a wiring pattern different from that of FIG. 7 is formed for the I/O cell of FIG. 7.

The I/O cells having different wiring patterns are shown in FIGS. 8 and 9. In the cell of FIG. 8, the input terminals of all the inverters 31 are connected in parallel with each other, and their output terminals are also connected in parallel with each other to constitute an output buffer 16. The parallel-connected output terminals of the inverters 31 are simultaneously connected to a pad 14 during formation of a wiring pattern.

In the cell of FIG. 9, a half of the input terminals and a half of the output terminals of the inverters 31 are connected in parallel with each other, respectively. The half of the inverters constitutes an input buffer 15, and the remaining half of the inverters constitutes an output buffer 16. The input terminals of the inverters 31 constituting the input buffer 15 are connected to a pad 14 through the input protective resistor 32, and the output terminals of the inverters 31 constituting the output buffer 16 are directly connected to the pad 14.

According to the present invention as has been described above, the buffers of the plurality of I/O cells are connected in parallel with each other to select an arbitrary load drive capacity. The present invention can also cope with a change in pad pitch by reducing the number n of I/O cells arranged for each pad. As a result, the I/O cell need not be designed again at the time of a change in pad pitch. Therefore, the load drive capacity can be arbitrarily selected without changing the size of the chip body.

What is claimed is:

1. A master slice type semiconductor integrated circuit comprising:
   a plurality of pads arranged at a predetermined pitch; and
   n, wherein n is an integer of 2 or more, I/O cells arranged for each of said plurality of pads, each I/O cell being provided with at least a buffer,
   wherein the n number of I/O cells per pad is set in accordance with the pad pitch.

2. A circuit according to claim 1, wherein said buffers included in said I/O cells have equal drive capacities.

3. A circuit according to claim 1, wherein each of said I/O cells includes an input protective resistor in addition to said buffer.

4. A master slice type semiconductor integrated circuit, comprising:
   a plurality of pads arranged at a predetermined pitch; and
   I/O cells, the number of which is an m, wherein m is an integer of 2 or more, multiple of pads, each I/O cell being provided with at least a buffer.

5. A circuit according to claim 4, wherein said buffers included in said I/O cells have equal drive capacities.

6. A circuit according to claim 4, wherein each of said I/O cells includes an input protective resistor in addition to said buffer.

* * * * *